(12) United States Patent
Toyama et al.

(10) Patent No.: US 8,552,523 B2
(45) Date of Patent: Oct. 8, 2013

(54) SEMICONDUCTOR DEVICE AND METHOD FOR MANUFACTURING

(75) Inventors: Fumiaki Toyama, Fukushima-Ken (JP); Fumihiko Inoue, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/206,380

(22) Filed: Aug. 9, 2011

(65) Prior Publication Data

US 2011/0291227 A1 Dec. 1, 2011

Related U.S. Application Data

(62) Division of application No. 12/337,461, filed on Dec. 17, 2008, now Pat. No. 7,994,007.

(30) Foreign Application Priority Data

Dec. 20, 2007 (JP) .................................. 2007-329364

(51) Int. Cl.
*H01L 21/70* (2006.01)
(52) U.S. Cl.
USPC ............... 257/506; 257/301; 257/E27.091; 257/E27.092; 257/E27.095; 257/E29.346; 257/E23.002; 438/259; 438/270; 438/287; 438/391; 438/700

(58) Field of Classification Search
None
See application file for complete search history.

(56) References Cited

U.S. PATENT DOCUMENTS

| | | | |
|---|---|---|---|
| 2005/0003616 A1 | 1/2005 | Lutze et al. | |
| 2005/0199939 A1* | 9/2005 | Lutze et al. | 257/315 |
| 2007/0090453 A1* | 4/2007 | Lee et al. | 257/330 |
| 2001/0111422 | 5/2007 | Lutze et al. | |
| 2008/0171416 A1* | 7/2008 | Fang et al. | 438/257 |

* cited by examiner

*Primary Examiner* — Yasser Abdelaziez

(57) ABSTRACT

A method for manufacturing a semiconductor device is disclosed. The method includes forming a shallow trench isolation (STI) region extending in a first direction on a semiconductor substrate, forming a mask layer extending in a second direction that intersects with the first direction on the semiconductor substrate and forming a trench on the semiconductor substrate by using the STI region and the mask layer as masks. In addition, the method includes forming a charge storage layer so as to cover the trench and forming a conductive layer on side surfaces of the trench and the mask layer. Word lines are formed from the conductive layer on side surfaces of the trench that oppose in the first direction by etching. The word lines are separated from each other and extend in the second direction.

11 Claims, 20 Drawing Sheets

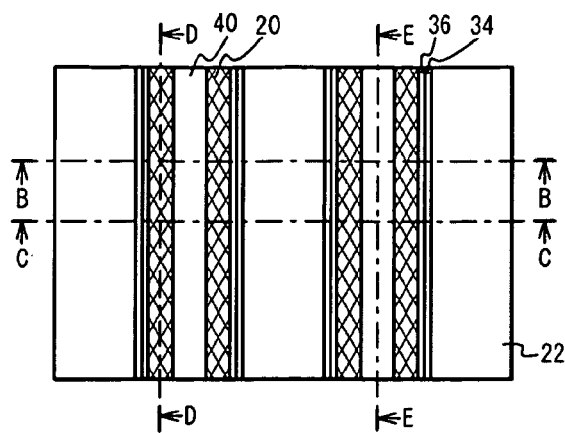
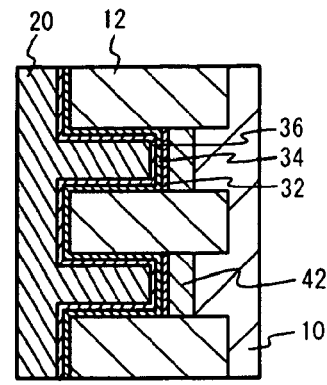
FIG. 17D
FIG. 17A
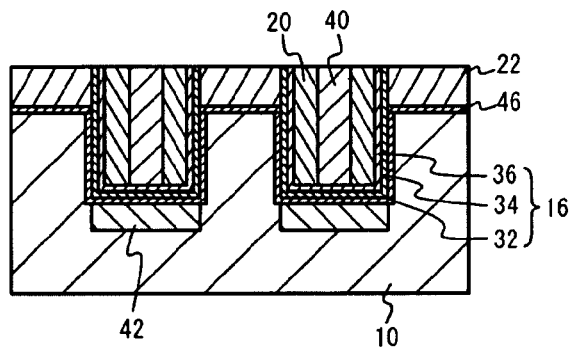
FIG. 17B
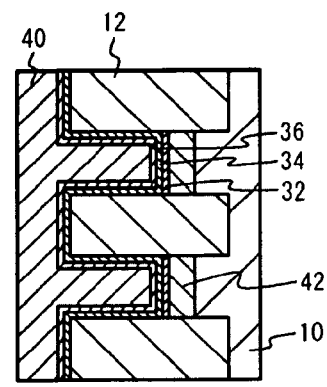
FIG. 17E
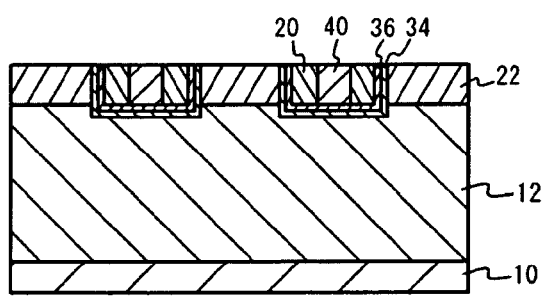
FIG. 17C

SEMICONDUCTOR DEVICE AND METHOD FOR MANUFACTURING

CROSS-REFERENCE TO RELATED APPLICATIONS

This application is a divisional of U.S. patent application Ser. No. 12/337,461, filed on Dec. 17, 2008, entitled "Semiconductor Device and Method for Manufacturing," which claims priority to Japanese Patent Application 2007-329364 entitled "Semiconductor device and Method for Manufacturing Thereof" filed on Dec. 20, 2007 which are hereby incorporated herein by reference in their entirety.

TECHNICAL FIELD

The present invention relates to a semiconductor device and a method for manufacturing the same and, more particularly, to a semiconductor device having word lines separated from each other on opposing side surfaces of a trench and a method for manufacturing the same.

BACKGROUND ART

In recent years, non-volatile memories, which are semiconductor memory devices which can retain data even when the power supply is turned off, have come into wide use. In flash memory a popular type of non-volatile memory, a transistor constituting a memory cell has either one of a floating gate or an insulating film, which is called a charge storage layer. The charge storage layer accumulates electrical charges, thereby storing data. As a flash memory provided with an insulating film as the charge storage layer, a silicon-oxide-nitride-oxide-silicon (SONOS) flash memory, accumulates electrical charges in a nitride film in an oxide-nitride-oxide (ONO) film.

Examples of SONOS flash memories include virtual ground flash memory, which activates a source region and a drain region by switching them so as to provide two charge storage regions in a charge storage layer of a single memory cell. In these devices, a single memory cell can store two-bit information. Such a virtual ground flash memory needs to have a long channel length to some extent to prevent complementary bit disturb (CBD), which is a interference phenomenon of that involves the accumulation of electrical charges in the two charge storage regions. Consequently, miniaturization of a memory cell can be problematic.

In view of this, flash memories having a charge storage layer on opposing side surfaces of a trench formed in a semiconductor substrate have been developed (see, for example, Japanese Patent Application Publication Nos. JP-A-2001-274366 and JP-A-2005-136426). Since the channel is provided along the side walls of the trench, a sufficient channel length can be secured, which can prevent CBD. In particular, two charge storage regions can be provided in each charge storage layer on opposing side surfaces of a trench, if a diffusion region is provided to the bottom surface and upper sides of the trench. In other words, a single trench can be provided with four charge storage regions, thereby storing four-bit information.

A NAND flash memory includes a shallow trench isolation (STI) region as well as the above-described trench. Further, to provide four charge storage regions in a single trench, word lines separated from each other need to be provided on opposing side surfaces of the trench. The manufacturing process, therefore, can be complicated, and it can be difficult to achieve a miniaturization of memory cells.

SUMMARY OF THE INVENTION

In view of the above-described problems, an object of the present invention is to provide a semiconductor device that facilitates forming of word lines separated from each other and extending on opposing side surfaces of a trench and enables the miniaturization of memory cells, and a method for manufacturing the same.

A method for manufacturing a semiconductor device is disclosed. The method includes forming a shallow trench isolation (STI) region extending in a first direction on a semiconductor substrate, forming a mask layer extending in a second direction that intersects with the first direction on the semiconductor substrate and forming a trench on the semiconductor substrate by using the STI region and the mask layer as masks. In addition, the method includes forming a charge storage layer so as to cover the trench and forming a conductive layer on side surfaces of the trench and the mask layer. Word lines are formed from the conductive layer on side surfaces of the trench that oppose in the first direction by etching. The word lines are separated from each other and extend in the second direction.

BRIEF DESCRIPTION OF THE DRAWINGS

The accompanying drawings, which are incorporated in and form a part of this specification, illustrate embodiments and, together with the description, serve to explain the principles of the embodiments:

FIG. 17A is a top view showing the method for manufacturing a NAND flash memory according to the first embodiment.

FIG. 17B is a cross-sectional view taken along the lines B-B shown in FIG. 17A.

FIG. 17C is a cross-sectional view taken along the lines C-C shown in FIG. 17A.

FIG. 17D is a cross-sectional view taken along the lines D-D shown in FIG. 17A.

FIG. 17E is a cross-sectional view taken along the lines E-E shown in FIG. 17A.

The drawings referred to in this description should not be understood as being drawn to scale except if specifically noted.

DETAILED DESCRIPTION

Reference will now be made in detail to various embodiments, examples of which are illustrated in the accompanying drawings. While descriptions will be provided in conjunction with these embodiments, it will be understood that the descriptions are not intended to limit the scope of the embodiments. On the contrary, the disclosure is intended to cover alternatives, modifications and equivalents, of these embodiments. Furthermore, in the following description, numerous specific details are set forth in order to provide a thorough understanding of embodiments. In other instances, well-known methods, procedures, components, and circuits have not been described in detail as not to unnecessarily obscure aspects of embodiments.

Figure 1A:
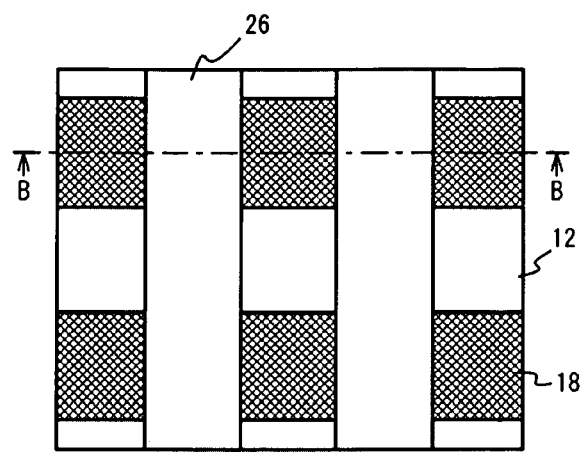
FIG. 1A is a top view showing a method for providing word lines separated from each other on opposing side surfaces of a trench in a NAND flash memory according to a first comparative example.
Figure 1B:
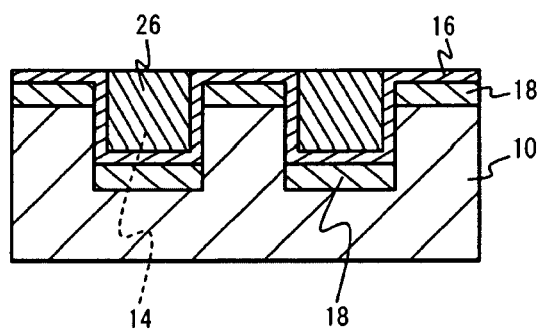
FIG. 1B is a cross-sectional view taken along the line B-B shown in FIG. 1A.
Figure 2A:
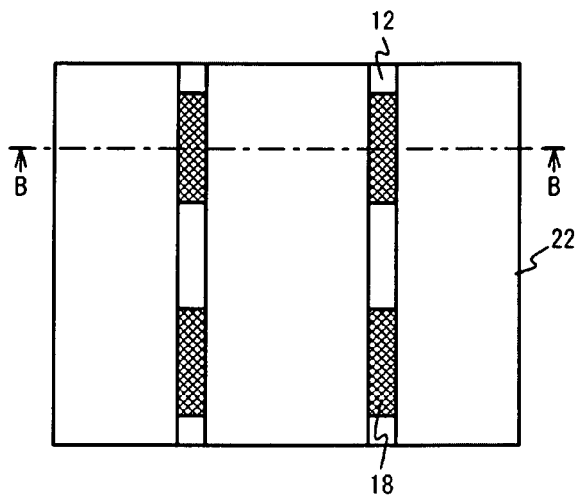
FIG. 2A is a top view showing the method for providing word lines separated from each other on opposing side surfaces of a trench in a NAND flash memory according to the first comparative example.

To clarify the problems to be solved, a method for providing word lines separated from each other on opposing side surfaces of each trench in a NAND flash memory according to a first comparative example will be described with reference to FIGS. 1A to 2B. FIGS. 1A and 2A show a diffusion region 18 and an STI region 12 viewed through an ONO film 16. To simplify the description, no description will be given of steps for providing the STI region 12, the trench 14, the ONO film 16, and the diffusion region 18 (the same will apply to a second comparative example). Referring to FIGS. 1A and 1B, a conductive layer 26 is provided so as to be embedded in each of the trenches 14 arranged in a matrix and extend in a second direction that intersects with another direction (first direction) in which the STI region 12 extends.

Figure 2B:
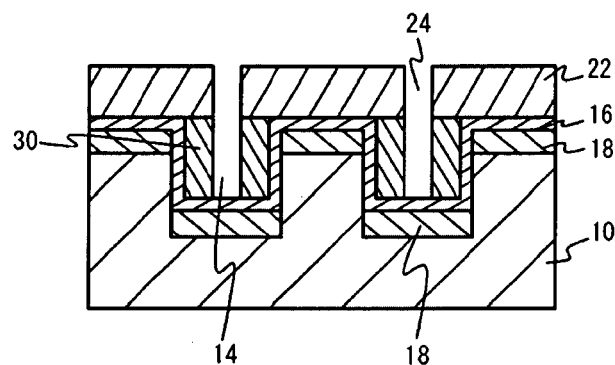
FIG. 2B is a cross-sectional view taken along the line B-B shown in FIG. 2A.

Referring to FIGS. 2A and 2B, a mask layer 22 is provided on a semiconductor substrate 10 so as to cover the conductive layer 26. The mask layer 22 is then formed with an opening 24 extending in the second direction on a central area of the trench 14 in the first direction. The conductive layer 26 is etched with the mask layer 22 serving as a mask. Consequently, gate electrodes 30 that are separated from each other are provided on side surfaces of the trench 14 that oppose in the first direction.

According to the manufacturing method of the first comparative example, the opening 24 is provided in the mask layer 22 on a central area of the trench 14 in the first direction. Since the opening 24 defines the gate electrodes 30 provided on the side surfaces of the trench 14 that oppose in the first direction, the opening 24 needs to be formed with high positional accuracy. However, since the trench 14 has a smaller width as the miniaturization of memory cells advances, it is difficult to form the opening 24 with high positional accuracy. This will limit further miniaturization of memory cells.

Figure 3A:
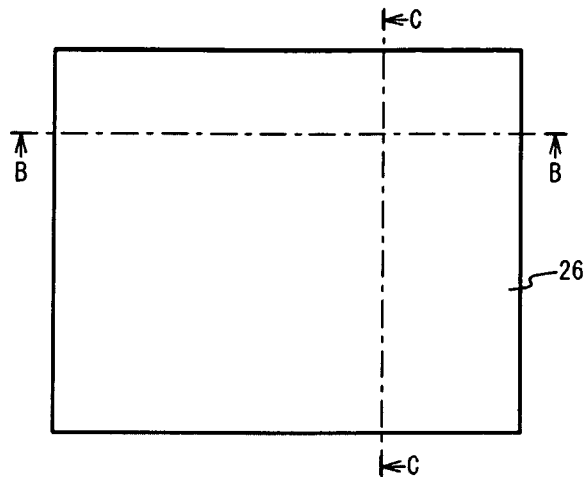
FIG. 3A is a top view showing a method for providing word lines separated from each other on opposing side surfaces of a trench in a NAND flash memory according to a second comparative example.
Figure 3B:
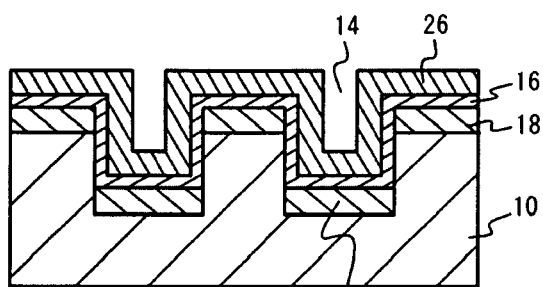
FIG. 3B is a cross-sectional view taken along the lines B-B shown in FIG. 3A.
Figure 3C:
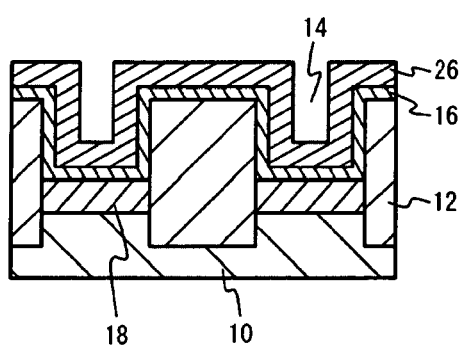
FIG. 3C is a cross-sectional view taken along the lines C-C shown in FIG. 3A.
Figure 4A:
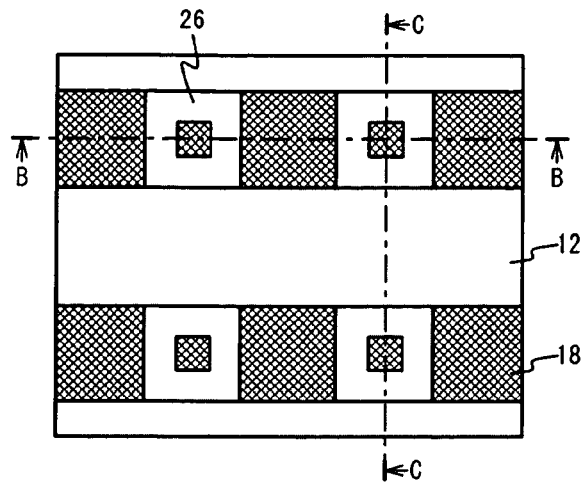
FIG. 4A is a top view showing the method for providing word lines separated from each other on opposing side surfaces of a trench in a NAND flash memory according to the second comparative example.

Next, referring to FIGS. 3A to 5C, a flash memory manufactured by another method for providing word lines separated from each other according to the second comparative example will be described. FIGS. 4A and 5A show the STI region 12 and the diffusion region 18 viewed through the ONO film 16 and an insulating film 28. Referring to FIGS. 3A to 3C, the conductive layer 26 is provided along the trench 14 on the ONO film 16.

Figure 4B:
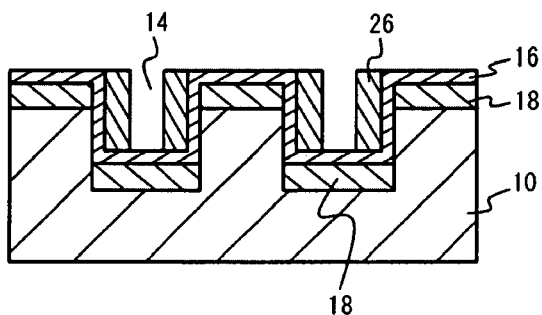
FIG. 4B is a cross-sectional view taken along the lines B-B shown in FIG. 4A.
Figure 4C:
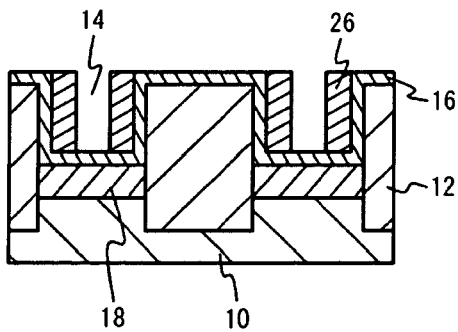
FIG. 4C is a cross-sectional view taken along the lines C-C shown in FIG. 4A.
Figure 5A:
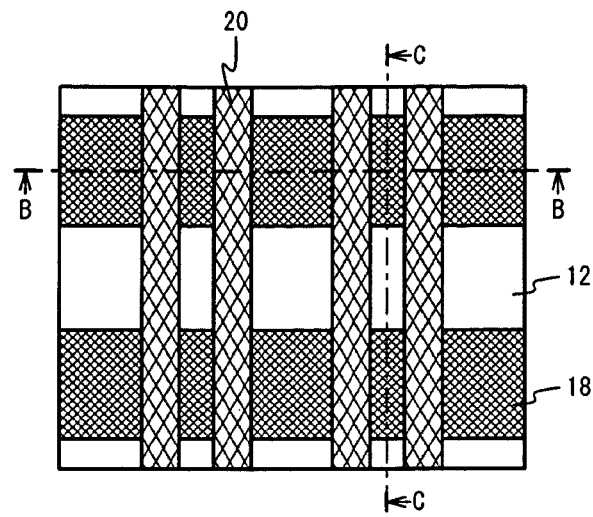
FIG. 5A is a top view showing the method for providing word lines separated from each other on opposing side surfaces of a trench in a NAND flash memory according to the second comparative example.

Referring to FIGS. 4A to 4C, the conductive layer 26 is thoroughly etched to expose the surface of the ONO film 16. As a consequence, the conductive layer 26 provided on a central area of the trench 14 is etched to be removed. That is, the conductive layer 26 remains on the side surfaces of the trench 14.

Figure 5B:
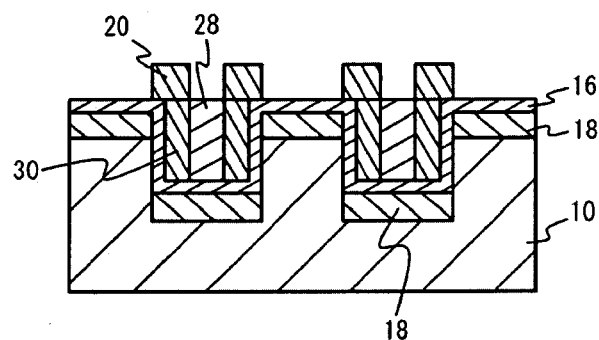
FIG. 5B is a cross-sectional view taken along the lines B-B shown in FIG. 5A.
Figure 5C:
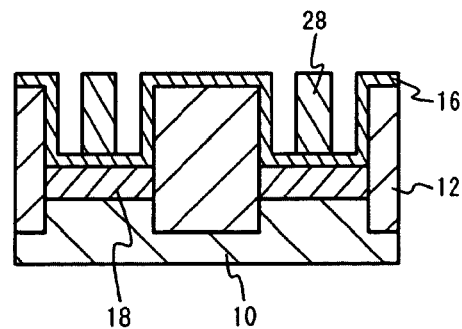
FIG. 5C is a cross-sectional view taken along the lines C-C shown in FIG. 5A.

Referring to FIGS. 5A to 5C, the insulating film 28 is provided so as to be embedded in the central area of the trench 14. On a central area of the trench 14 in the first direction, a mask layer (not shown) extending in the second direction and having an opening is provided. The conductive layer 26 is then etched with this mask layer serving as a mask. Consequently, the conductive layer 26 on side surfaces of the trench 14 that oppose in the second direction is etched, while the conductive layer 26 remaining on the other side surfaces of the trench 14 that oppose in the first direction becomes the gate electrodes 30 separated from each other. Subsequently, word lines 20 extending in the second direction are provided on the gate electrodes 30.

According to the manufacturing method of the second comparative example, as shown in FIGS. 4A to 4C, the conductive layer 26 is etched back until the surface of the ONO film 16 is exposed. Consequently, as shown in FIGS. 5A to 5C, the gate electrodes 30 provided in trenches 14 arranged adjacently in the second direction are separated from each other. Therefore, the word lines 20 extending in the second direction need to be formed on the gate electrodes 30. However, when the gate electrodes 30 have a smaller thickness as the miniaturization of memory cells advances, it is difficult to form the word lines 20 with high positional accuracy on the gate electrodes 30. This will limit further miniaturization of memory cells. To solve these problems, an embodiment according to the present invention, which facilitates forming of word lines separated from each other on opposing side surfaces of a trench and enables further miniaturization of memory cells, will now be described.

Figure 6A:
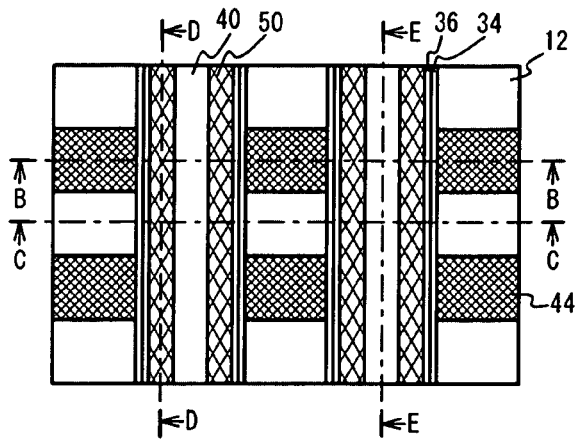
FIG. 6A is a top view showing a NAND flash memory according to a first embodiment of the present invention.
Figure 6D:
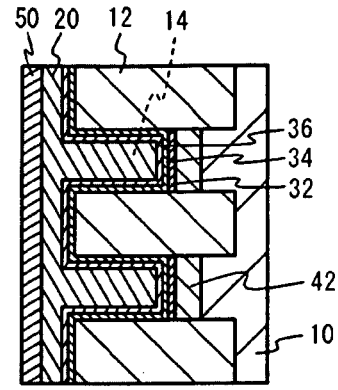
FIG. 6D is a cross-sectional view taken along the lines D-D shown in FIG. 6A.
Figure 6B:
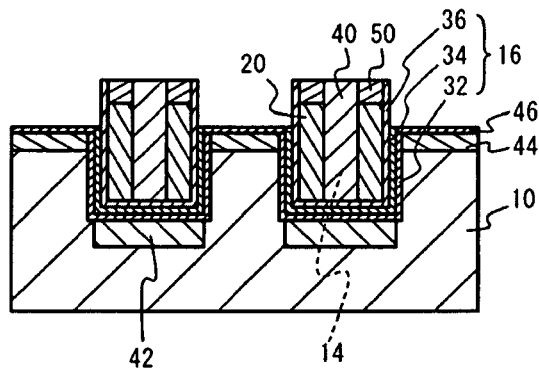
FIG. 6B is a cross-sectional view taken along the lines B-B shown in FIG. 6A.
Figure 6E:
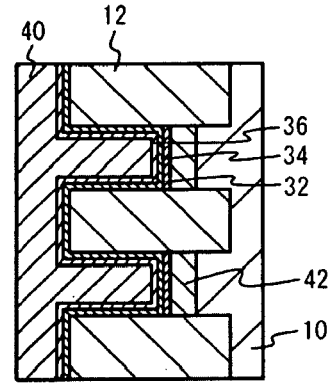
FIG. 6E is a cross-sectional view taken along the lines E-E shown in FIG. 6A.
Figure 6C:
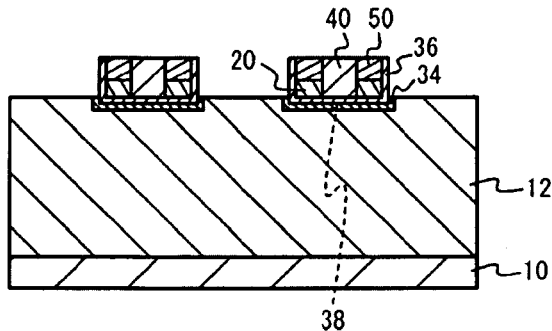
FIG. 6C is a cross-sectional view taken along the lines C-C shown in FIG. 6A.
Figure 7A:
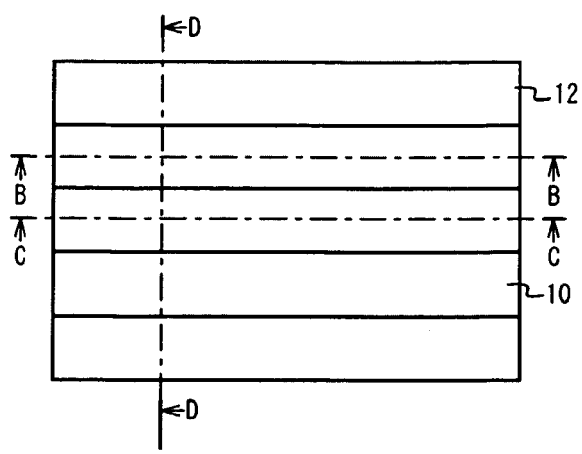
FIG. 7A is a top view showing a method for manufacturing a NAND flash memory according to the first embodiment.
Figure 7D:
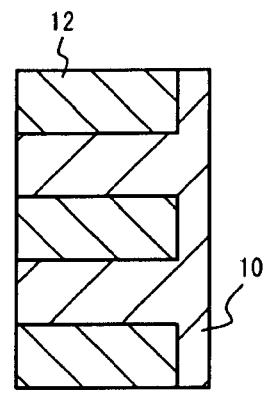
FIG. 7D is a cross-sectional view taken along the lines D-D shown in FIG. 7A.
Figure 7B:
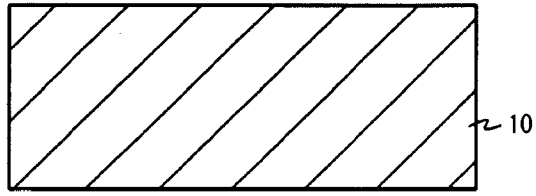
FIG. 7B is a cross-sectional view taken along the lines B-B shown in FIG. 7A.
Figure 7C:
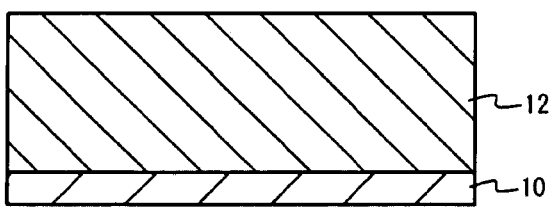
FIG. 7C is a cross-sectional view taken along the lines C-C shown in FIG. 7A.
Figure 8A:
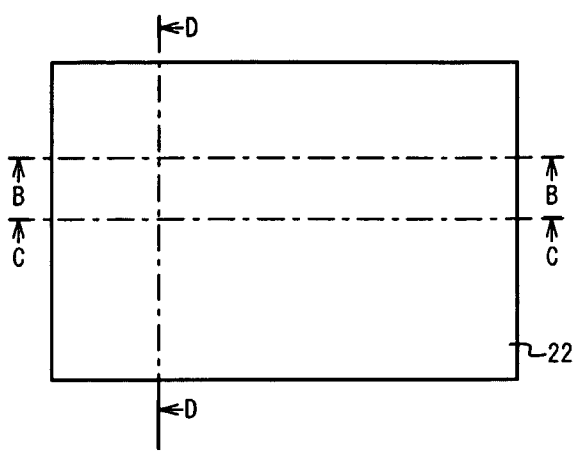
FIG. 8A is a top view showing a method for manufacturing a NAND flash memory according to the first embodiment.
Figure 8D:
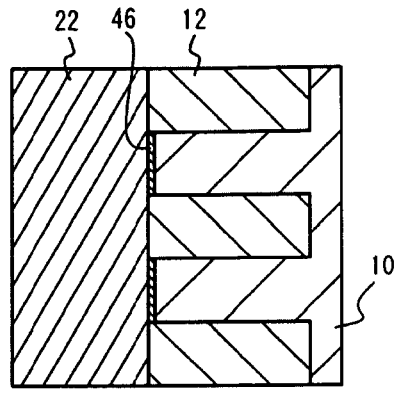
FIG. 8D is a cross-sectional view taken along the lines D-D shown in FIG. 8A.
Figure 8B:
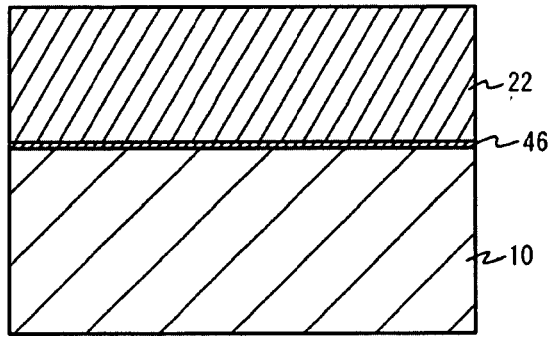
FIG. 8B is a cross-sectional view taken along the lines B-B shown in FIG. 8A.
Figure 8C:
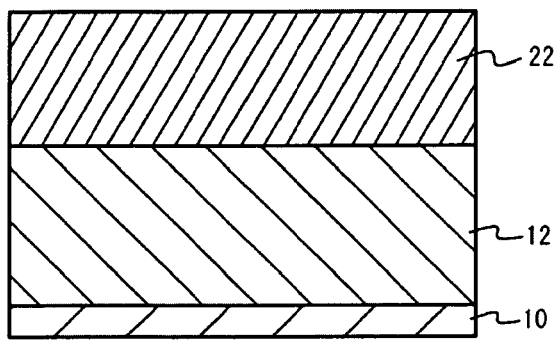
FIG. 8C is a cross-sectional view taken along the lines C-C shown in FIG. 8A.
Figure 9A:
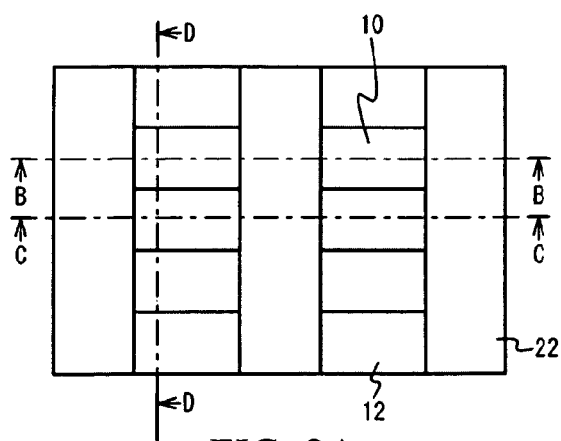
FIG. 9A is a top view showing the method for manufacturing a NAND flash memory according to the first embodiment.
Figure 9D:
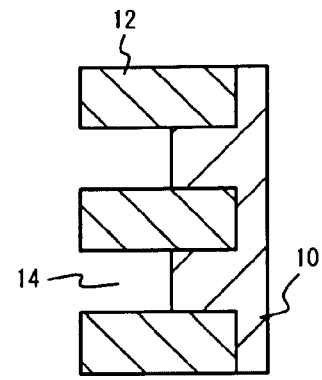
FIG. 9D is a cross-sectional view taken along the lines D-D shown in FIG. 9A.
Figure 9B:
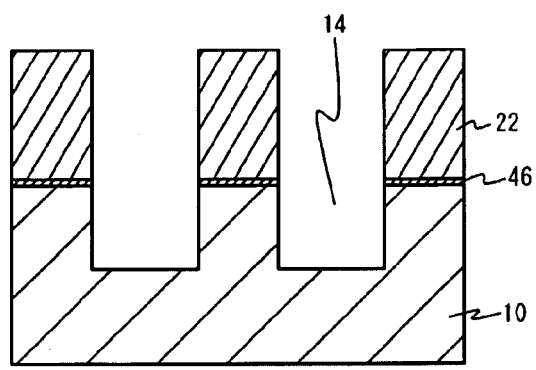
FIG. 9B is a cross-sectional view taken along the lines B-B shown in FIG. 9A.
Figure 9C:
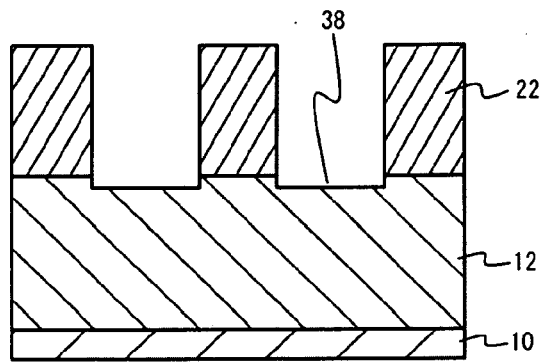
FIG. 9C is a cross-sectional view taken along the lines C-C shown in FIG. 9A.
Figure 10A:
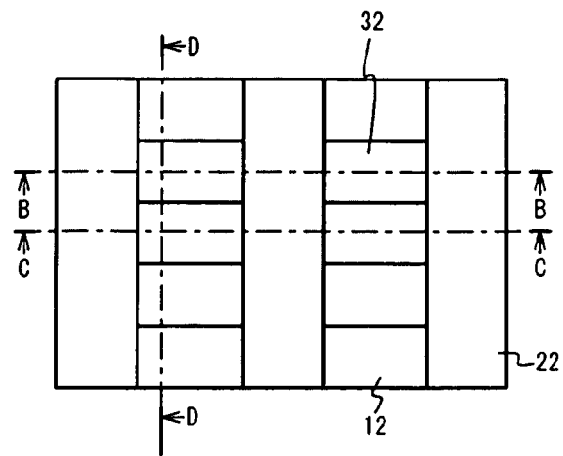
FIG. 10A is a top view showing the method for manufacturing a NAND flash memory according to the first embodiment.
Figure 10D:
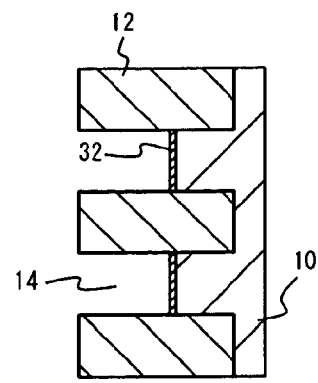
FIG. 10D is a cross-sectional view taken along the lines D-D shown in FIG. 10A.
Figure 10B:
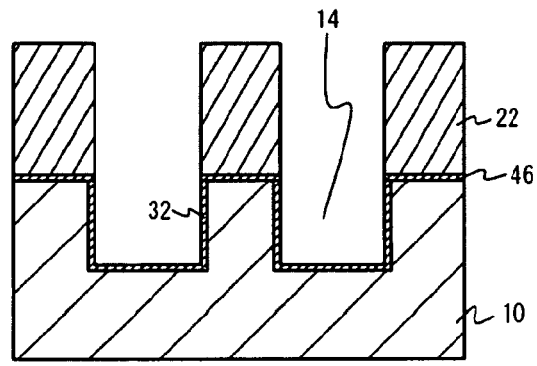
FIG. 10B is a cross-sectional view taken along the lines B-B shown in FIG. 10A.
Figure 10C:
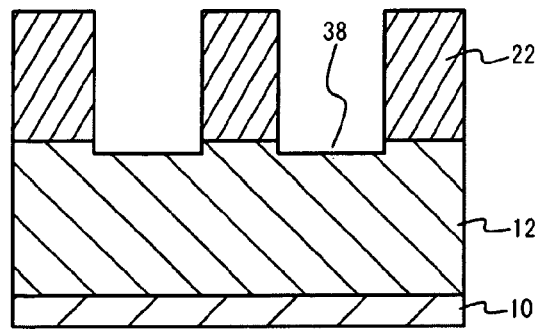
FIG. 10C is a cross-sectional view taken along the lines C-C shown in FIG. 10A.
Figure 11A:
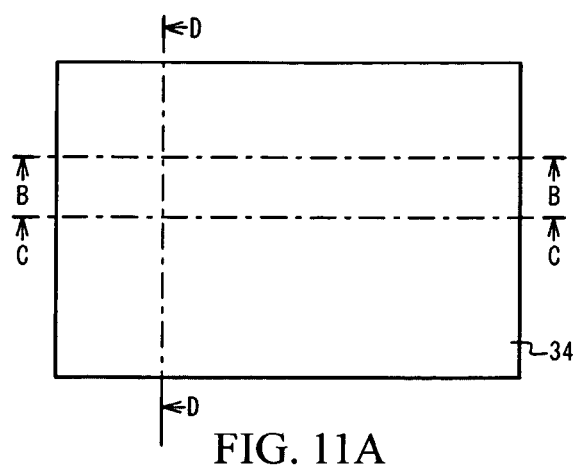
FIG. 11A is a top view showing the method for manufacturing a NAND flash memory according to the first embodiment.
Figure 11D:
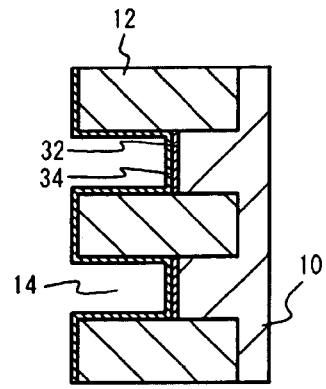
FIG. 11D is cross-sectional view taken along the lines D-D shown in FIG. 11A.
Figure 11B:
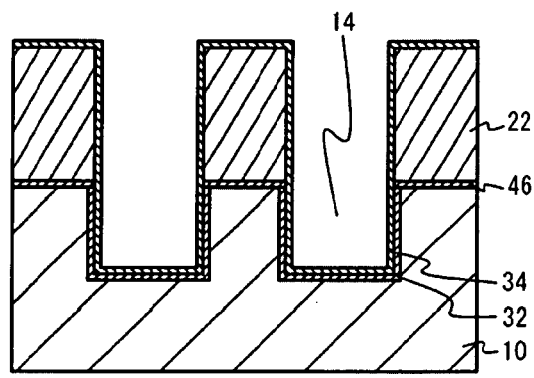
FIG. 11B is cross-sectional view taken along the lines B-B shown in FIG. 11A.
Figure 11C:
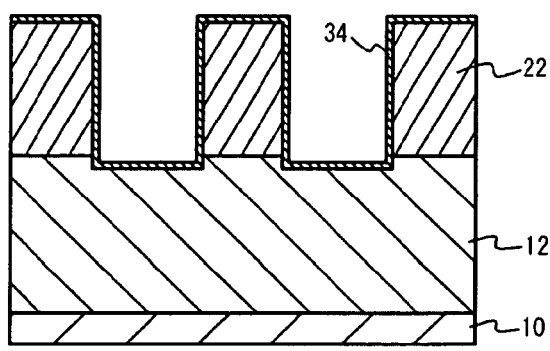
FIG. 11C is cross-sectional view taken along the lines C-C shown in FIG. 11A.
Figure 12A:
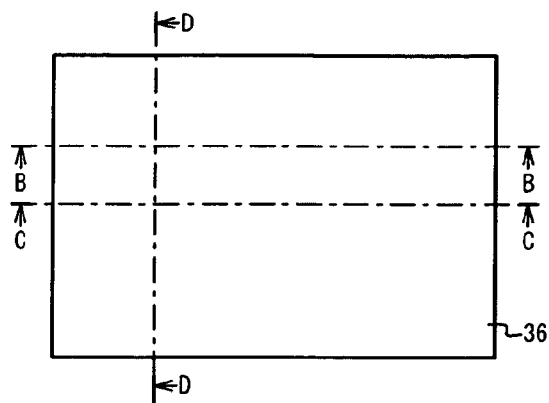
FIG. 12A is a top view showing the method for manufacturing a NAND flash memory according to the first embodiment.
Figure 12D:
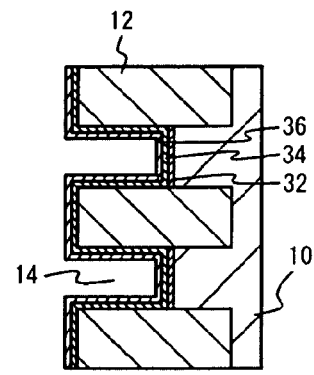
FIG. 12D is a cross-sectional view taken along the lines D-D shown in FIG. 12A.
Figure 12B:
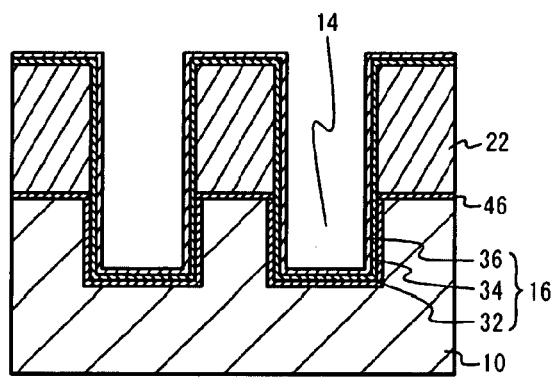
FIG. 12B is a cross-sectional view taken along the lines B-B shown in FIG. 12A.
Figure 12C:
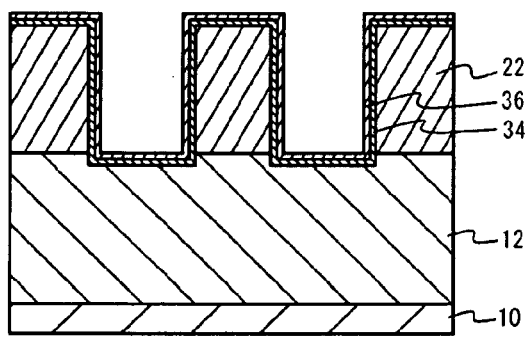
FIG. 12C is a cross-sectional view taken along the lines C-C shown in FIG. 12A.
Figure 13A:
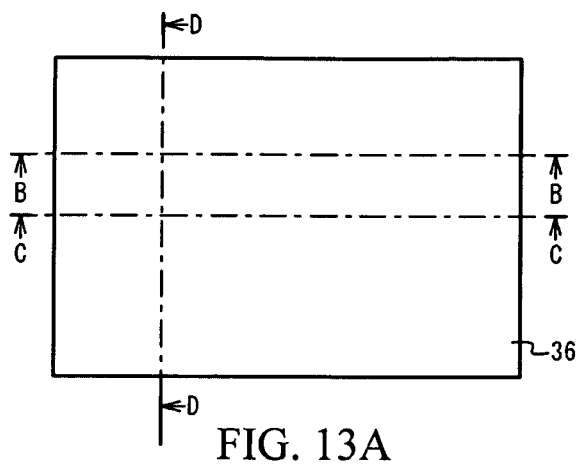
FIG. 13A is a top view showing the method for manufacturing a NAND flash memory according to the first embodiment.
Figure 13D:
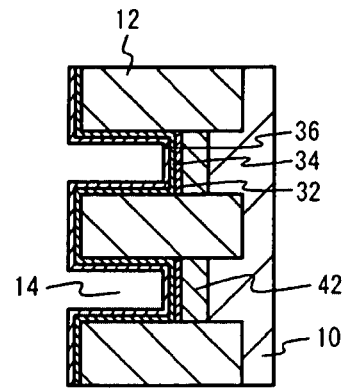
FIG. 13D is a cross-sectional view taken along the line D-D shown in FIG. 13A.
Figure 13B:
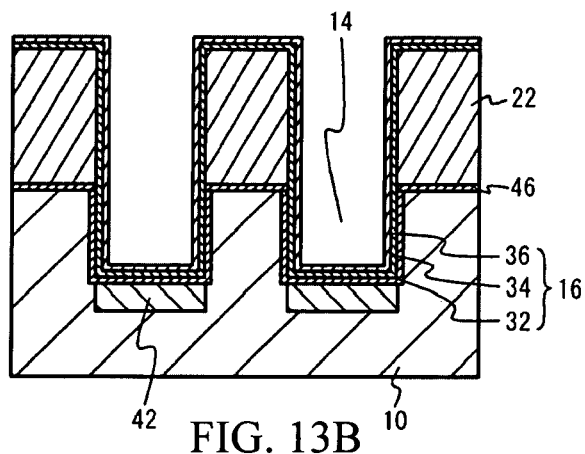
FIG. 13B is a cross-sectional view taken along the line B-B shown in FIG. 13A.
Figure 13C:
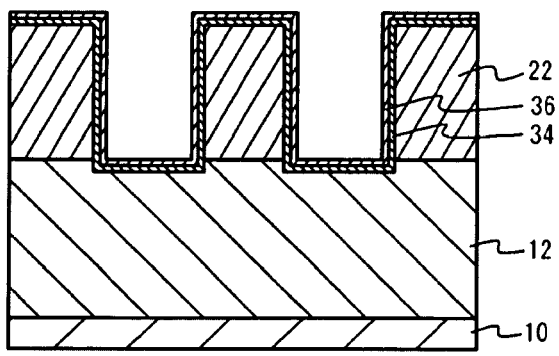
FIG. 13C is a cross-sectional view taken along the line C-C shown in FIG. 13A.
Figure 14A:
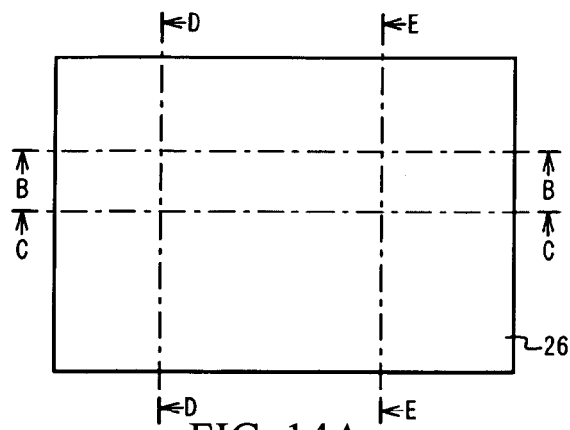
FIG. 14A is a top view showing the method for manufacturing a NAND flash memory according to the first embodiment.
Figure 14D:
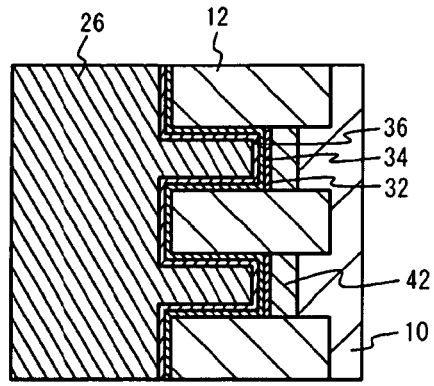
FIG. 14D is a cross-sectional view taken along the lines D-D shown in FIG. 14A.
Figure 14B:
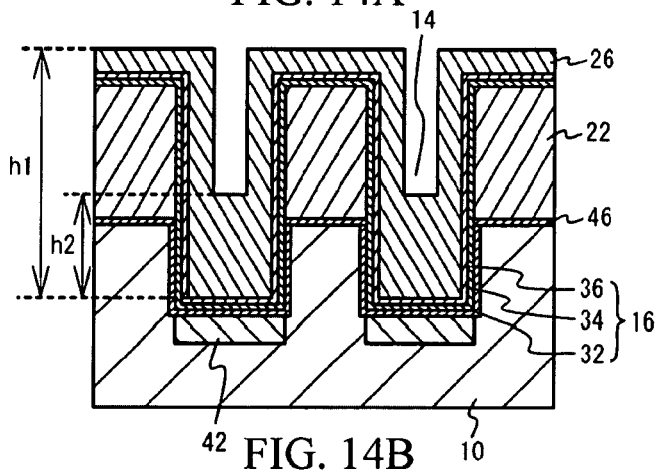
FIG. 14B is a cross-sectional view taken along the lines B-B shown in FIG. 14A.
Figure 14E:
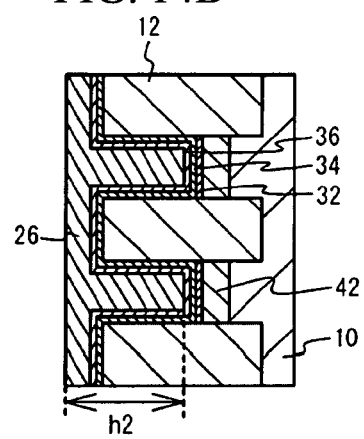
FIG. 14E is a cross-sectional view taken along the lines E-E shown in FIG. 14A.
Figure 14C:
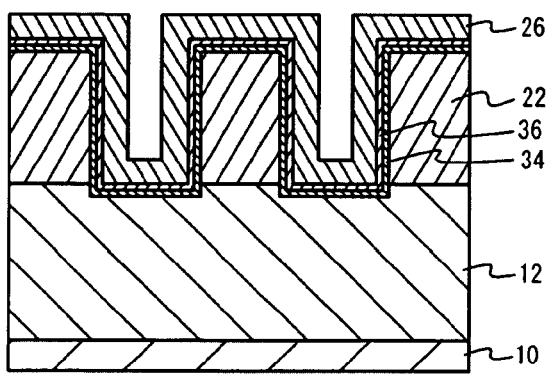
FIG. 14C is a cross-sectional view taken along the lines C-C shown in FIG. 14A.
Figure 15A:
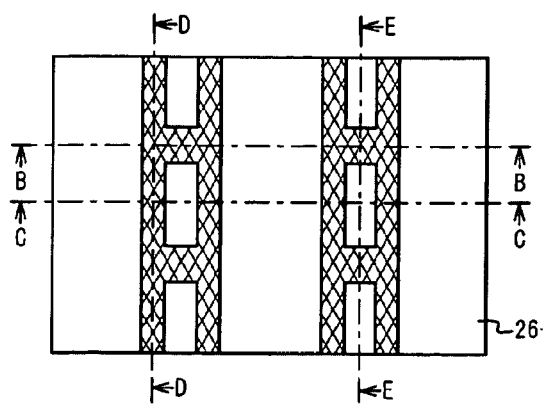
FIG. 15A is a top view showing the method for manufacturing a NAND flash memory according to the first embodiment.
Figure 15D:
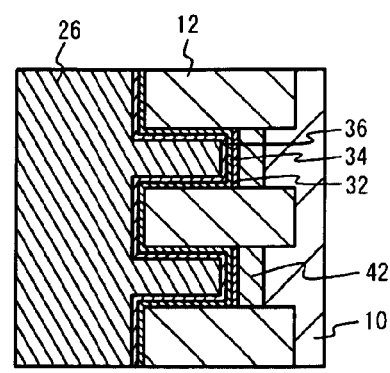
FIG. 15D is a cross-sectional view taken along the lines D-D shown in FIG. 15A.
Figure 15B:
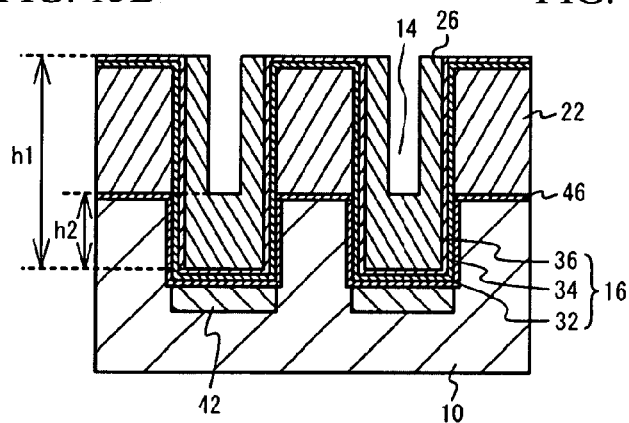
FIG. 15B is a cross-sectional view taken along the lines B-B shown in FIG. 15A.
Figure 15E:
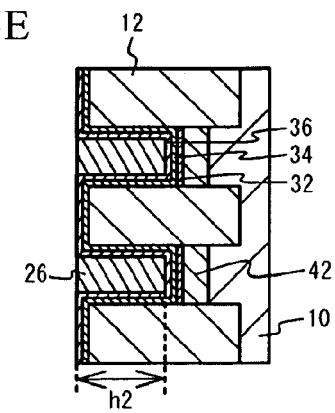
FIG. 15E is a cross-sectional view taken along the lines E-E shown in FIG. 15A.
Figure 15C:
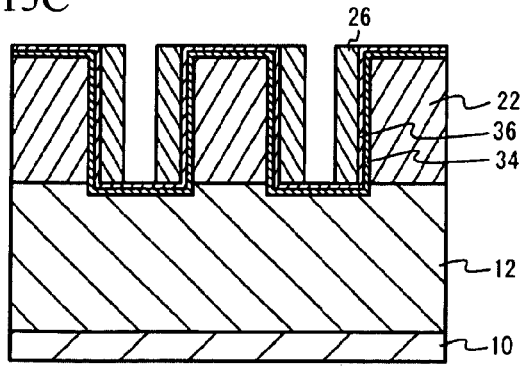
FIG. 15C is a cross-sectional view taken along the lines C-C shown in FIG. 15A.
Figure 16A:
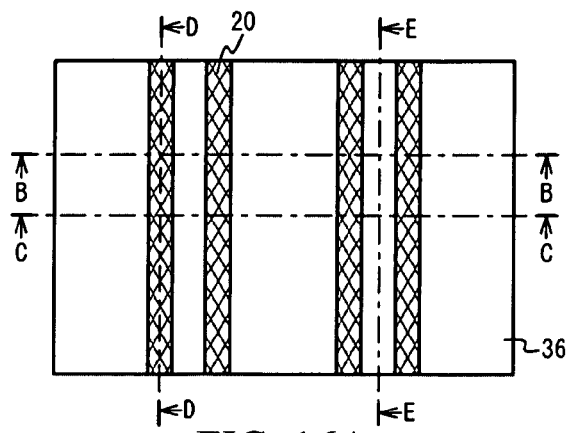
FIG. 16A is a top view showing the method for manufacturing a NAND flash memory according to the first embodiment.
Figure 16D:
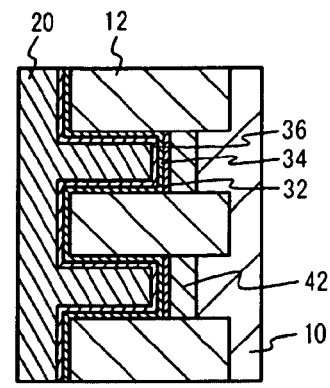
FIG. 16D is a cross-sectional view taken along the lines D-D shown in FIG. 16A.
Figure 16B:
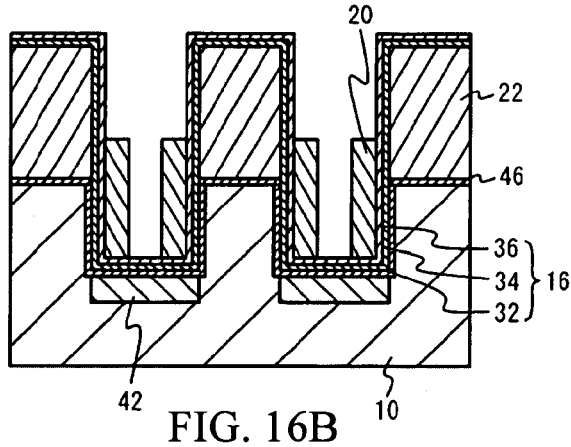
FIG. 16B is a cross-sectional view taken along the lines B-B shown in FIG. 16A.
Figure 16E:
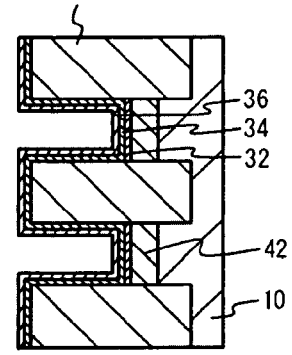
FIG. 16E is a cross-sectional view taken along the lines E-E shown in FIG. 16A.
Figure 16C:
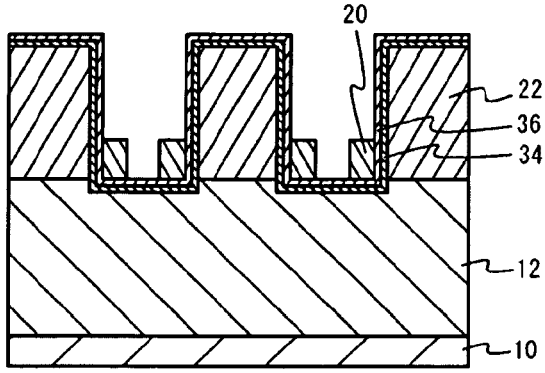
FIG. 16C is a cross-sectional view taken along the lines C-C shown in FIG. 16A.
Figure 18A:
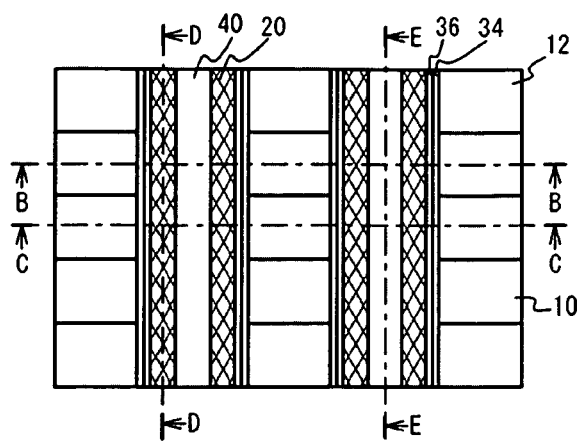
FIG. 18A is a top view showing the method for manufacturing a NAND flash memory according to the first embodiment.
Figure 18D:
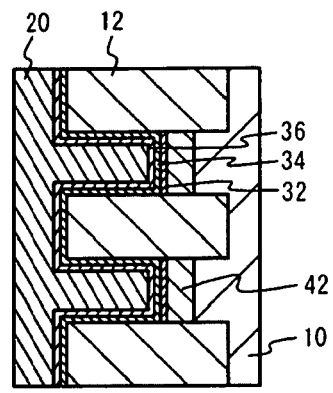
FIG. 18D is a cross-sectional views taken along the lines D-D shown in FIG. 18A.
Figure 18B:
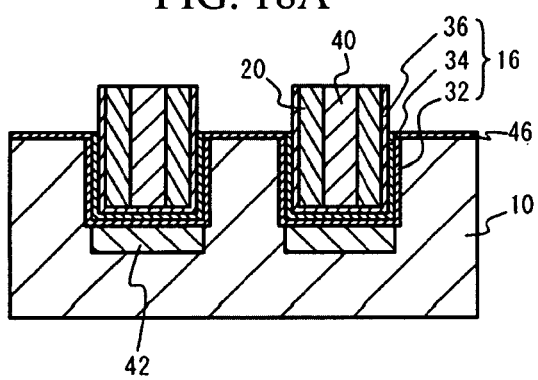
FIG. 18B is a cross-sectional views taken along the lines B-B shown in FIG. 18A.
Figure 18E:
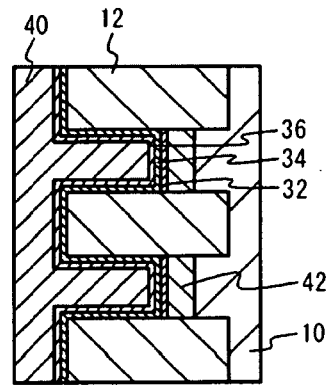
FIG. 18E is a cross-sectional views taken along the lines E-E shown in FIG. 18A.
Figure 18C:
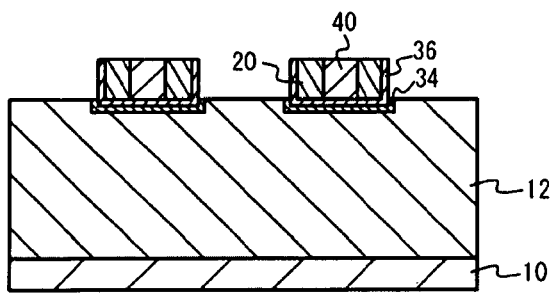
FIG. 18C is a cross-sectional views taken along the lines C-C shown in FIG. 18A.
Figure 19A:
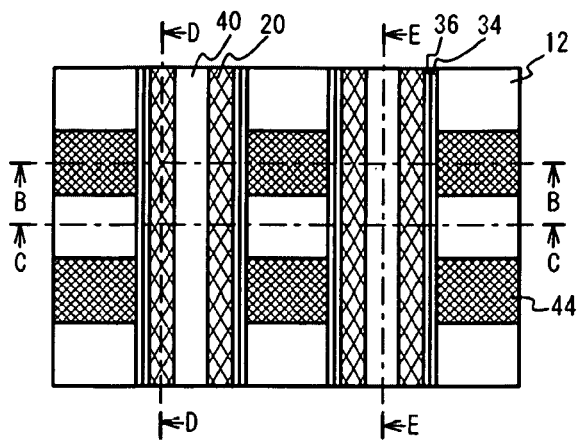
FIG. 19A is a top view showing the method for manufacturing a NAND flash memory according to the first embodiment.
Figure 19D:
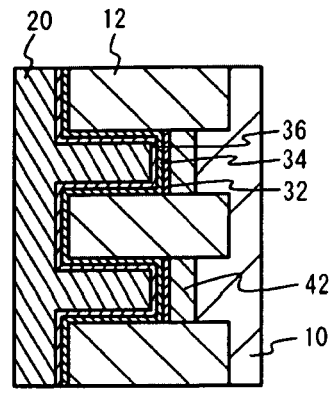
FIG. 19D is a cross-sectional views taken along the lines D-D shown in FIG. 19A.
Figure 19B:
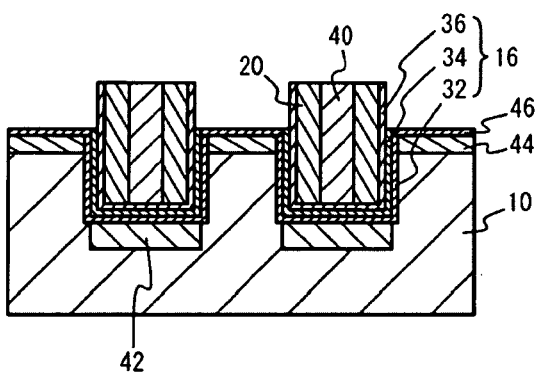
FIG. 19B is a cross-sectional views taken along the lines B-B shown in FIG. 19A.
Figure 19E:
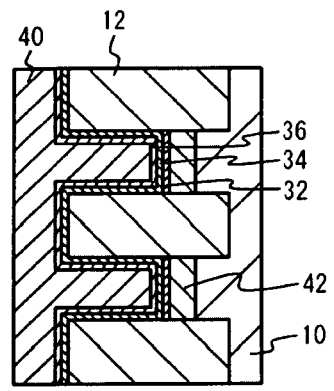
FIG. 19E is a cross-sectional views taken along the lines E-E shown in FIG. 19A.
Figure 19C:
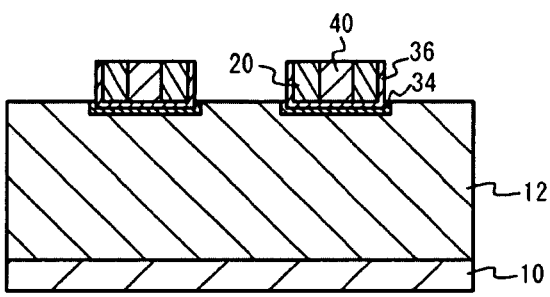
FIG. 19C is a cross-sectional views taken along the lines C-C shown in FIG. 19A.
Figure 20A:
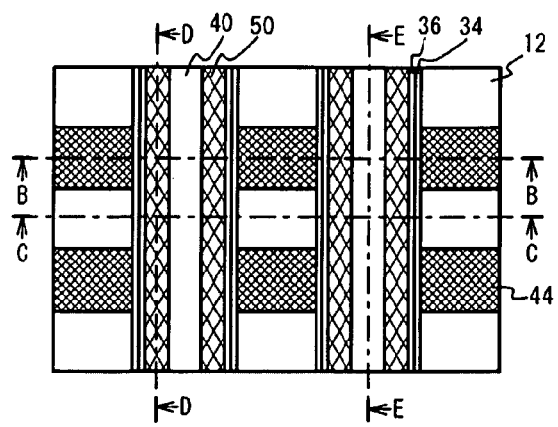
FIG. 20A is a top view showing the method for manufacturing a NAND flash memory according to the first embodiment.
Figure 20D:
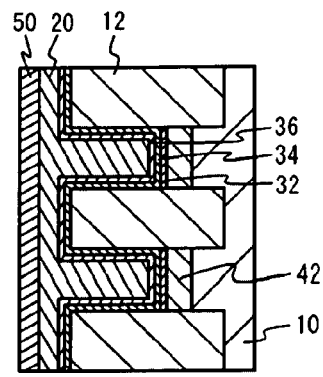
FIG. 20D is a cross-sectional view taken along the lines D-D shown in FIG. 20A.
Figure 20B:
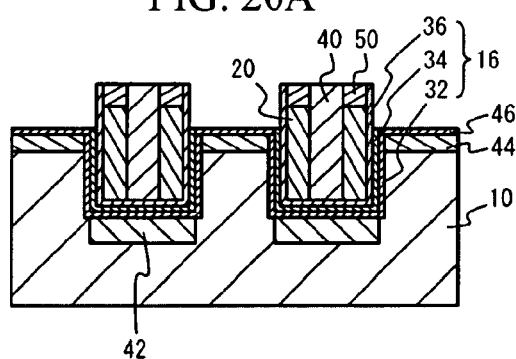
FIG. 20B is a cross-sectional view taken along the lines B-B shown in FIG. 20A.
Figure 20E:
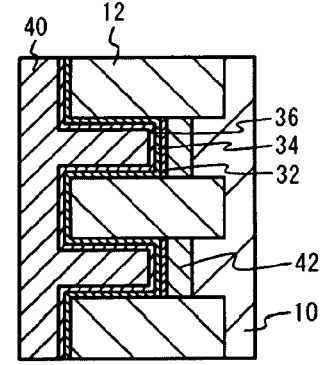
FIG. 20E is a cross-sectional view taken along the lines E-E shown in FIG. 20A.
Figure 20C:
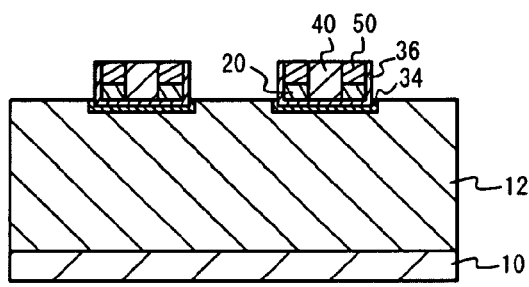
FIG. 20C is a cross-sectional view taken along the lines C-C shown in FIG. 20A.

FIG. 6A is a plan view of a NAND flash memory according to a first embodiment of the present invention. FIGS. 6B to 6E are cross-sectional views taken along the lines B-B to E-E, respectively, shown in FIG. 6A. FIG. 6A shows a second diffusion region 44 viewed through a first silicon oxide film 46. Referring to FIGS. 6A and 6C, the STI region 12 extending in the first direction is provided on the semiconductor substrate 10. Referring next to FIGS. 6A, 6B, and 6D, each of the trenches 14 is arranged in a matrix to run between two adjacent STI regions 12 on the semiconductor substrate 10. Specifically, side surfaces of the trench 14 that oppose in the first direction are in contact with the semiconductor substrate 10, while the other side surfaces of the trench 14 that oppose in the second direction, which intersects with the first direction, are in contact with the STI region 12. On the side surfaces of the trench 14 that oppose in the first direction, the ONO film 16 composed of a tunnel insulating film 32, a charge storage layer 34, and a top insulating layer 36 is provided. Also on the side surfaces of the trench 14 that oppose in the first direction, the word lines 20 are provided so as to be separated from each other and extend in the second direction while coming in contact with the ONO film 16. The upper and lower widths of each word line 20 in the first direction are the same. In other words, the word line 20 is formed inside the trench 14. An upper portion of the word line 20 is silicided to lower its resistance, whereby a silicide layer 50 is formed.

Referring to FIGS. 6A to 6C, a recessed portion 38 is formed in the STI region 12 between trenches 14 arranged adjacently in the second direction. Accordingly, the trenches 14 and recessed portions 38 are arranged alternately in the second direction. The word lines 20 extend in the second direction bridging the trenches 14 and recessed portions 38 alternately. The upper surface of each word line 20 (i.e., the upper surface of the silicide layer 50) protrudes from the surface of the semiconductor substrate 10 and the surface of the STI region 12. The charge storage layer 34 formed in the STI region 12 is embedded in the recessed portion 38.

Referring to FIGS. 6A to 6E, a second silicon oxide film 40 is provided so as to extend in the second direction between the word lines 20. In the semiconductor substrate 10, a first diffusion region 42 is provided on the bottom surface of each trench 14, and a second diffusion region 44 is provided on both upper sides of each trench 14.

A method for manufacturing a NAND flash memory according to the one embodiment of the present invention will be described with reference to FIGS. 7A to 20E. Referring to FIGS. 7A to 7D, a mask layer (not shown) having a width of 65 nm and extending in the first direction is provided on the semiconductor substrate 10, which may be a p-type silicon substrate, at an interval of 65 nm. The semiconductor substrate 10 is then etched by reactive ion etching (RIE) with the mask layer serving as a mask. Consequently, grooves (not shown) having a width of 65 nm and a depth of 200 nm are formed in the semiconductor substrate 10 at an interval of 65 nm. So as to be embedded in the grooves, a silicon oxide film is provided by high density plasma chemical vapor deposition (CVD). The silicon oxide film is then removed by chemical mechanical polishing (CMP) until the surface of the semiconductor substrate 10 is exposed. As a result, the STI regions 12, formed of the silicon oxide film, having a width of 65 nm and a depth of 200 nm and extending in the first direction are provided in the semiconductor substrate 10 at an interval of 65 nm.

Referring to FIGS. 8A to 8D, a first silicon oxide film 46 having a thickness of 10 nm is provided on the semiconductor substrate 10 by thermal oxidation. This process makes the thickness of the first silicon oxide film 46 larger than the thickness of the charge storage layer 34, which will be described later. The mask layer 22, formed of a silicon nitride film having a thickness of 150 nm, is then provided on the semiconductor substrate 10 by CVD. This process makes the thickness of the mask layer 22 larger than the depth of the trench 14, which will be described later.

Referring to FIGS. 9A to 9D, a photoresist (not shown) having a width of 65 nm and extending in the second direction, which intersects with the first direction, is provided on the mask layer 22 at an interval of 130 nm. The mask layer 22 is then etched by RIE with the photoresist serving as a mask. Consequently, the mask layer 22 has a width of 65 nm and extends in the second direction at an interval of 130 nm. The photoresist is then removed, and thereafter the first silicon oxide film 46 and the semiconductor substrate 10 are etched by RIE with the mask layer 22 and the STI region 12 serving as masks. As a result, the trench 14 having a long-side length of 130 nm, a short-side length of 65 nm, and a depth of 100 nm is formed in the semiconductor substrate 10. Side surfaces of the trench 14 that oppose in the first direction are in contact with the semiconductor substrate 10, while the other side surfaces of the trench 14 that oppose in the second direction are in contact with the STI region 12. While the first silicon oxide film 46 is being etched, the STI region 12 serving as a mask is also partly etched. As a result, the recessed portion 38 is formed to have a depth larger than the thickness of the charge storage layer 34, which will be described later.

Referring to FIGS. 10A to 10D, the semiconductor substrate 10 is oxidized by thermal oxidization. The tunnel insulating film 32 formed of a silicon oxide film having a thickness of 5 nm is provided inside the trench 14 on the semiconductor substrate 10. Next, referring to FIGS. 11A to 11D, a silicon nitride film is thoroughly deposited by CVD. Consequently, the charge storage layer 34 formed of the silicon nitride film having a thickness of 5 nm is provided inside the trench 14. The charge storage layer 34 formed in the recessed portion 38 in the STI region 12 is embedded in the recessed portion 38, since the depth of the recessed portion 38 is larger than the thickness of the charge storage layer 34. In other words, the upper surface of the charge storage layer 34 formed in the recessed portion 38 is closer to the semiconductor substrate 10 than the upper surface of the STI region 12.

Referring to FIGS. 12A to 12D, a silicon oxide film is thoroughly deposited by CVD. In this manner the top insulating film 36 formed of the silicon oxide film having a thickness of 10 nm is provided along the charge storage layer 34. As a consequence, the ONO film 16 composed of the tunnel insulating film 32, the charge storage layer 34, and the top insulating layer 36 is provided on the side surfaces of the trench 14 that oppose in the first direction. Referring to FIGS. 13A to 13D, arsenic ions are implanted in the semiconductor substrate 10 on the bottom surface of the trench 14 with the STI region 12 and the mask layer 22 serving as masks. The first diffusion region 42 that is an n-type diffusion region is thus provided.

Referring to FIGS. 14A to 14E, the conductive layer 26 formed of an amorphous silicon film (or a polysilicon film) having a thickness of 30 nm is thoroughly deposited on the top insulating film 36 by CVD. In this manner, the conductive layer 26 is embedded in the trench 14 and provided along the side and top surfaces of the mask layer 22. Accordingly, the height h1 of the conductive layer 26 provided in the vicinity of ends of the trench 14 in the first direction is larger than the height h2 of the conductive layer 26 provided on a central area of the trench 14 in the first direction.

Referring to FIGS. 15A to 15E, the conductive layer 26 is thoroughly etched by an amount equivalent to its thickness by RIE using HBr, $Cl_2$, and $O_2$ gases. The conductive layer 26 above the mask layer 22 is thus removed, whereby the top insulating film 36 is exposed. Consequently, the height h1 of the conductive layer 26 in the vicinity of the ends of the trench 14 in the first direction becomes the same level as the sum of the depth of the trench 14 and the thickness of the mask layer 22. Meanwhile, the height h2 of the conductive layer 26 on the central area of the trench 14 in the first direction becomes the same level as the depth of the trench 14.

Referring to FIGS. 16A to 16E, the conductive layer 26 is thoroughly etched again by an amount equivalent to the depth of the trench 14 by RIE using HBr, $Cl_2$, and $O_2$ gases. Since the height h2 of the conductive layer 26 on the central area of the trench 14 in the first direction is the same level as the depth of the trench 14, the conductive layer 26 on the central area of the trench 14 in the first direction is completely removed. On the other hand, since the height h1 of the conductive layer 26 in the vicinity of the ends of the trench 14 in the first direction is the same level as the sum of the depth of the trench 14 and the thickness of the mask layer 22, the conductive layer 26 in the vicinity of the ends of the trench 14 in the first direction is not completely removed but remains. Consequently, the word lines 20 formed of the conductive layer 26 and separated from each other can be provided on the side surfaces of the trench 14 that oppose in the first direction. The word lines 20 also serve as gate electrodes. Specifically, the word lines 20 function as gate electrodes in the trench 14.

Referring to FIGS. 17A to 17E, the second silicon oxide film 40 is provided so as to be embedded between the word lines 20 by high density plasma CVD. The mask layer 22 and the second silicon oxide film 40 are polished thereafter by CMP until the upper surfaces of the word lines 20 are exposed. In the CMP process, the end of the process can be determined by detecting, using laser light, that the word lines 20 have been exposed. The mask layer 22 is then removed by RIE using $CH_3F$ and $O_2$ gases or by wet etching using phosphoric acid with reference to FIGS. 18A to 18E.

Referring to FIGS. 19A to 19E, arsenic ions are implanted in the semiconductor substrate 10 with the word lines 20, the second silicon oxide film 40, and the STI region 12 serving as masks. Consequently, the second diffusion region 44 that is an n-type diffusion region is provided on both upper sides of the trench 14 in the semiconductor substrate 10. Next, referring to FIGS. 20A to 20E, Ti or Co is thoroughly deposited on the semiconductor substrate 10 and is subjected to thermal processing. The silicide layer 50 is thus formed on the upper portions of the word lines 20.

According to the manufacturing method of the first embodiment, as shown in FIGS. 9A to 9D, the STI region 12 extending in the first direction is provided on the semiconductor substrate 10, and thereafter the mask layer 22 extending in the second direction, which intersects with the first direction, is provided on the semiconductor substrate 10. Then, the trenches 14 are formed in the semiconductor substrate 10 using the STI region 12 and the mask layer 22 as masks. The trenches 14 are thus arranged in a matrix on the semiconductor substrate 10. As shown in FIGS. 14A to 14E, the conductive layer 26 is provided so as to be embedded in each trench 14 and run along the side and upper surfaces of the mask layer 22. Accordingly, the height h1 of the conductive layer 26 in the vicinity of the ends of the trench 14 in the first direction is larger than the height h2 of the conductive layer 26 on the central area of the trench 14 in the first direction. Then, as shown in FIGS. 15A to 16E, the conductive layer 26 is thoroughly etched to remove the conductive layer 26 on the central area of the trench 14 in the first direction. The height h1 of the conductive layer 26 in the vicinity of the ends of the trench 14 in the first direction is larger than the height h2 of the conductive layer 26 on the central area of the trench 14 in the first direction. Therefore, the conductive layer 26 remains on the side surfaces of the trench 14 that oppose in the first direction, even if the conductive layer 26 is completely removed on the central area of the trench 14 in the first direction. Consequently, the word lines 20 separated from each other can be provided on the side surfaces of the trench 14 that oppose in the first direction. The upper and lower widths of each word line 20 are the same.

As described above, according to the manufacturing method of the first embodiment, by thoroughly etching the conductive layer 26, the word lines 20 separated from each other can be easily provided on the side surfaces of the trench 14 that oppose in the first direction in a self-aligning manner. This prevents the manufacturing process from becoming complicated unlike the first comparative example, which requires forming of the opening 24 with high positional accuracy in the mask layer 22 on a central area in the trench 14.

Furthermore, the present embodiment can achieve further miniaturization of memory cells than the first comparative example does.

In particular, as shown in FIGS. 8A to 8D, the thickness of the mask layer 22 is made larger than the depth of the trench 14. Consequently, as shown in FIGS. 14A to 14E, the height h1 of the conductive layer 26 in the vicinity of the ends of the trench 14 in the first direction is at least twice as large as the height h2 of the conductive layer 26 on the central area of the trench 14 in the first direction. Therefore, as shown in FIGS. 15A to 16E, the upper surface of the conductive layer 26 remaining in the vicinity of the ends of the trench 14 in the first direction protrudes from the upper surface of the semiconductor substrate 10, even if the conductive layer 26 is thoroughly etched and completely removed on the central area of the trench 14 in the first direction. In other words, the word lines 20 are provided so as to protrude from the upper surface of the semiconductor substrate 10 on the side surfaces of the trench 14 that oppose in the first direction. The word lines 20 thus can be extended in the second direction. This prevents the manufacturing process from becoming complicated unlike the second comparative example, which requires a process for providing the word lines 20 separately from a process for providing the gate electrodes 30 in the trench 14. Furthermore, the present embodiment can achieve further miniaturization of memory cells than the second comparative example does.

Further, the upper surfaces of the word lines 20 protruding from the upper surface of the semiconductor substrate 10 prevent contact plugs mounted on the word lines 20 from coming in abnormal contact with the semiconductor substrate 10. This makes a contact margin for fabricating such contact plugs large.

Referring to FIGS. 8A to 8D, the first silicon oxide film 46 having a larger thickness than the thickness of the charge storage layer 34 is provided on the semiconductor substrate 10 before the mask layer 22 is provided. Accordingly, as shown in FIGS. 9A to 9D, the STI region 12 between the trenches 14 is etched while the trenches 14 are formed on the semiconductor substrate 10 and the recessed portion 38 having a larger depth than the thickness of the charge storage layer 34 is formed. By providing the charge storage layer 34 in this state, as shown in FIGS. 11A to 11D, the charge storage layer 34 formed in the STI region 12 is embedded in the recessed portion 38.

The mask layer 22 and the charge storage layer 34 are both formed of a silicon nitride film. Therefore, there is a concern that the charge storage layer 34 may be removed while the mask layer 22 is removed as shown in FIGS. 18A to 18E. For example, once the charge storage layer 34 formed in the STI region 12 has been removed, the word lines 20 on the charge storage layer 34 may be disconnected in the STI region 12. However, according to the manufacturing method the first embodiment, the charge storage layer 34 in the STI region 12 is provided so as to be embedded in the recessed portion 38 in the STI region 12. Thus, the charge storage layer 34 formed in the STI region 12 is less likely to be removed even in a case where a process for removing the mask layer 22 is performed. This prevents the word lines 20 from getting disconnected in the STI region 12. In particular, the use of wet etching with phosphoric acid or other isotropic etching methods to remove the mask layer 22 enhances this advantageous effect.

As shown in FIGS. 17A to 17E, the mask layer 22 and the like are polished until the upper surfaces of the word lines 20 are exposed. Accordingly, the upper surfaces of the word lines 20 can be easily made to protrude from the upper surface of the semiconductor substrate 10. In particular, the end of the polishing process is preferably determined by a method for securely detecting that the surfaces of the word lines 20 have been exposed, for example, by a method for detecting by laser light that the surfaces of the word lines 20 have been exposed as in the first embodiment, or by a method for detecting any change in the material being polished.

To provide the word lines 20 separated from each other on the side surfaces of the trench 14 that oppose in the first direction, as shown in FIGS. 15A to 15E, a first etching process is performed for thoroughly etching the conductive layer 26 by an amount equivalent to its thickness. Subsequently, as shown in FIGS. 16A to 16E, a second etching process is performed for thoroughly etching the conductive layer 26 by an amount equivalent to the depth of the trench 14. Accordingly, the conductive layer 26 on the central area of the trench 14 in the first direction can be easily and securely removed and the word lines 20 separated from each other can be easily provided on the side surfaces of the trench 14 that oppose in the first direction. In this case, at the first etching process, the end of etching process may be determined by confirming that the top insulating film 36 has been exposed. At the second etching process, overetching to some extent may be allowed to remove the conductive layer 26 on the central area of the trench 14 in the first direction more reliably.

Further, as shown in FIGS. 13A to 13E, the first diffusion region 42 is provided on the bottom surface of the trench 14 in the semiconductor substrate 10. Also, the second diffusion region 44 is provided on both upper sides of the trench 14 in the semiconductor substrate 10 as shown in FIGS. 19A to 19E. Accordingly, the two charge storage regions can be provided to each of the ONO film 16 on the side surfaces of each trench 14 that oppose in the first direction. In other words, each trench 14 can store four-bit information.

In the first embodiment, as shown in FIGS. 14A to 14E, while an example in which the conductive layer 26 is provided so as to be embedded in the trench 14 has been described, the present invention is not limited to this as long as the conductive layer 26 is provided at least along the side surfaces of the trench 14. In this case, too, the use of the manufacturing method according to the first embodiment can provide the word lines 20 separated from each other on the side surfaces of the trench 14 that oppose in the first direction.

With reference to exemplary embodiments thereof, a method for manufacturing a semiconductor device is disclosed. The method includes forming a shallow trench isolation (STI) region extending in a first direction on a semiconductor substrate, forming a mask layer extending in a second direction that intersects with the first direction on the semiconductor substrate and forming a trench on the semiconductor substrate by using the STI region and the mask layer as masks. In addition, the method includes forming a charge storage layer so as to cover the trench and forming a conductive layer on side surfaces of the trench and the mask layer. Word lines are formed from the conductive layer on side surfaces of the trench that oppose in the first direction by etching. The word lines are separated from each other and extend in the second direction.

In one embodiment, the forming of the mask layer may include forming the mask layer to have a thickness larger than the depth of the trench. This method can make the upper surfaces of the word lines protrude from the upper surface of the semiconductor substrate, thereby extending the word line in the second direction.

In one embodiment, the forming of the trench may include forming a recessed portion having a depth larger than the thickness of the charge storage layer in the STI region between two adjacent trenches in the second direction. This method can prevent the word lines from getting disconnected in the STI region.

In one embodiment, the above described method may also include polishing the mask layer until the top surfaces of the word lines are exposed. This method can easily make the upper surfaces of the word lines protrude from the upper surface of the semiconductor substrate.

In one embodiment, the forming of the conductive layer may include thoroughly depositing the conductive layer on the semiconductor substrate, and the forming of the word lines may include a first etching process to etch the conductive layer by an amount equivalent to the thickness thereof, and a second etching process to etch the conductive layer by an amount equivalent to the depth of the trench.

In one embodiment, the above-described method may also include: forming a first diffusion region on a bottom surface of the trench in the semiconductor substrate, and forming a second diffusion region on both upper sides of the trench in the semiconductor substrate.

According to one embodiment of the present invention, there is provided a semiconductor device that includes: a semiconductor substrate provided with trenches arranged in a matrix, a shallow trench isolation (STI) region formed between the trenches in a second direction on the semiconductor substrate and extending in a first direction that intersects with the second direction, a charge storage layer formed on side surfaces of the trench that oppose in the first direction, and word lines formed on side surfaces of the trench that oppose in the first direction, the word lines being separated from each other and extending in the second direction. In manufacturing the semiconductor device according to one embodiment, the word lines are separated from each other and extend in the second direction can be formed by etching on the side surfaces of the trench that oppose in the first direction. The arrangement can prevent the manufacturing process from becoming complicated and achieve miniaturization of memory cells.

In one embodiment, the upper and lower widths of each of the word lines in the first direction can be substantially the same. In the above-described arrangement, the upper surface of each of the word lines can protrude from the upper surface of the semiconductor substrate. This arrangement can prevent contact plugs mounted on the word lines from coming in abnormal contact with the semiconductor substrate.

In one embodiment, a recessed portion can be formed in the STI region between the trenches in the second direction under the word lines, and the charge storage layer formed in the STI region can be provided so as to be embedded in the recessed portion. This arrangement can prevent the word lines from getting disconnected in the STI region.

The foregoing descriptions of specific embodiments have been presented for
purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

The invention claimed is:

1. A semiconductor device comprising:
a semiconductor substrate provided with trenches arranged in a matrix;
a shallow trench isolation (STI) region formed between the trenches that are disposed in a second direction on the semiconductor substrate and extending in a first direction that intersects with the second direction;
a charge storage layer formed inside the trench; and
word lines formed on side surfaces of the trench that oppose in the first direction, the word lines being separated from each other and extending in the second direction, wherein an upper surface of each of the word lines protrudes from an upper surface of the semiconductor substrate.

2. The semiconductor device according to claim 1, wherein upper and lower widths of each of the word lines in the first direction are substantially the same.

3. The semiconductor device according to claim 1, wherein a recessed portion is formed in the STI region between the trenches in the second direction under the word lines, and
the charge storage layer formed in the STI region is provided so as to be embedded in the recessed portion.

4. The semiconductor device according to claim 1, wherein the trench includes a recessed portion that has a depth larger than a thickness of the charge storage layer in the STI region between two adjacent trenches in the second direction.

5. The semiconductor device according to claim 1, further comprising a first diffusion region on a bottom surface of the trench in the semiconductor substrate.

6. The semiconductor device according to claim 5, further comprising a second diffusion region formed on both upper sides of the trench in the semiconductor substrate.

7. A flash memory device, comprising:
input components;
output components; and
an array of memory cell components comprising:
a semiconductor substrate provided with trenches arranged in a matrix;
a shallow trench isolation (STI) region formed between the trenches that are disposed in a second direction on the semiconductor substrate and extending in a first direction that intersects with the second direction;
a charge storage layer formed inside the trench; and
word lines formed on side surfaces of the trench that oppose in the first direction, the word lines being separated from each other and extending in the second direction, wherein an upper surface of each of the word lines protrudes from an upper surface of the semiconductor substrate.

8. The flash memory device according to claim 7, wherein upper and lower widths of each of the word lines in the first direction are substantially the same.

9. The flash memory device according to claim 7, wherein a recessed portion is formed in the STI region between the trenches in the second direction under the word lines, and the charge storage layer is formed in the STI region and is provided so as to be embedded in the recessed portion.

10. The flash memory device according to claim 7, wherein the trench includes a recessed portion that has a depth larger than a thickness of the charge storage layer in the STI region between two adjacent trenches in the second direction.

11. The flash memory device according to claim 7, further comprising a first diffusion region on a bottom surface of the trench in the semiconductor substrate.

* * * * *